United States Patent
Watkins

(10) Patent No.: US 9,219,181 B2
(45) Date of Patent: Dec. 22, 2015

(54) APPARATUS FOR GENERATING ELECTRICITY USING AN OPTICAL FIBER CABLE LIGHT SOURCE AND RELATED METHODS

(71) Applicant: Daniel Robert Watkins, New Richmond, OH (US)

(72) Inventor: Daniel Robert Watkins, New Richmond, OH (US)

( * ) Notice: Subject to any disclaimer, the term of this patent is extended or adjusted under 35 U.S.C. 154(b) by 375 days.

(21) Appl. No.: 13/710,769

(22) Filed: Dec. 11, 2012

(65) Prior Publication Data

US 2014/0158182 A1    Jun. 12, 2014

(51) Int. Cl.
*H01L 31/048*    (2014.01)
*H01L 31/054*    (2014.01)
*H02J 11/00*    (2006.01)

(52) U.S. Cl.
CPC .......... *H01L 31/048* (2013.01); *H01L 31/0547* (2014.12); *H02J 11/00* (2013.01)

(58) Field of Classification Search
CPC .............. H01L 31/0547; H01L 31/048; H01L 31/02325; G02B 6/262
USPC ........................................................ 136/246
See application file for complete search history.

(56) References Cited

U.S. PATENT DOCUMENTS

| 4,529,830 | A | | 7/1985 | Daniel |
| 4,912,522 | A | | 3/1990 | Oates et al. |
| 4,976,789 | A | * | 12/1990 | Holloman ............ G02B 6/4204 136/246 |
| 5,089,055 | A | | 2/1992 | Nakamura |
| 5,193,201 | A | | 3/1993 | Tymes |
| 5,575,860 | A | | 11/1996 | Cherney |
| 5,859,719 | A | | 1/1999 | Dentai et al. |
| 5,932,029 | A | | 8/1999 | Stone et al. |
| 7,359,647 | B1 | | 4/2008 | Faria et al. |
| 7,813,646 | B2 | | 10/2010 | Furey |
| 2004/0144043 | A1 | * | 7/2004 | Stevenson et al. ............ 52/173.3 |
| 2004/0264838 | A1 | * | 12/2004 | Uchida et al. .................... 385/14 |
| 2008/0072958 | A1 | | 3/2008 | Dutta |
| 2008/0216888 | A1 | * | 9/2008 | Miller ................. H01L 31/0522 136/246 |
| 2008/0236652 | A1 | | 10/2008 | Defries et al. |
| 2011/0056485 | A1 | | 3/2011 | Saluccio |
| 2011/0090678 | A1 | | 4/2011 | Saluccio |
| 2011/0103088 | A1 | * | 5/2011 | Wemmer ....................... 362/555 |

OTHER PUBLICATIONS

OSRAM Knowledge: The LED Light Colors.*
Chandler, D., All-carbon solar cell harnesses infrared light, New type of photovoltaic device harnesses heat radiation that most solar cells ignore, MIT News Office, Jun. 21, 2012 (2 pages) [http://web.mit.edu/newsoffice/2012/infrared-photovoltaic-0621.html?tmpl=component&print=1.

(Continued)

*Primary Examiner* — Jennifer Michener
*Assistant Examiner* — Sadie White
(74) *Attorney, Agent, or Firm* — Wood, Herron & Evans, LLP

(57) ABSTRACT

An apparatus for generating electricity using an optical fiber cable light source and for directing the electricity to an electrical circuit configured to be coupled with an electric utility's electric grid. The apparatus includes an enclosure having an input configured to be coupled with the light source for directing light into the enclosure. The apparatus further includes a photovoltaic module contained within the enclosure and configured to generate electricity from the light. The apparatus further includes an electrical output cable coupled with the photovoltaic module and configured to be coupled with the electrical circuit.

17 Claims, 3 Drawing Sheets

(56) References Cited

OTHER PUBLICATIONS

Spectral Products, Performance and Ingenuity, Light Source, found on Oct. 9, 2012 at http://www.spectralproducts.com/lightsources?gclid=CNmtxYqA9LICFUHNOgod9QQAKQ, reprinted May 6, 2013 (3 pages).

Hecht, J., Contributing Editor, Photonic Frontiers: Photonic power delivery: Photonic power conversion delivers power via laser beams; LaserFocusWorld, printed Jul. 17, 2012, laserfocusworld.com/.../photonic-frontiers-photonic-power-delivery-photonic-power-conversion-deliv . . . (4 pages).

Ab-Rahman et al., Portable wireless CATV tester unit with solar panel, Space Science and Communication, 2009, IconSpace 2009, International Conference on; Date of Conference Oct. 26-27, 2009, IEEE Explore abstract page (1 page).

JDSU—Photovoltaics—For Generating & Measuring Energy; JDS Uniphase Corporation, 2012, printed Jul. 17, 2012 (1 page).

Alucobond® is the original ACM (Aluminum Composite Material), 3A Composites USA, 2012 (1 page).

Sculpted Silica Fiber Tips, Polymicro Technologies, a Subsidiary of molex, Jul. 28, 2008 (2 pages).

Mason, M., eHow Contributor, LED & Full Spectrum, eHow, undated (1 page).

* cited by examiner

APPARATUS FOR GENERATING ELECTRICITY USING AN OPTICAL FIBER CABLE LIGHT SOURCE AND RELATED METHODS

FIELD OF THE INVENTION

The present invention generally relates to devices and methods for generating electric power. More particularly, the present invention relates to apparatus and methods for generating electric power using photovoltaic modules.

BACKGROUND

Until relatively recently, telephone, television, and other communications services had been provided to homes, offices, and other consumers almost exclusively through copper-based cables. In these copper-based cables, the telephone, television, and other signals are transmitted along copper wires in the cable. Also until relatively recently, the cables associated with different services were provided separately to a consumer. For example, a household might have at one time had telephone service provided through a telephone cable and its television service provided through a separate coaxial cable. These services were commonly provided by different providers, such as a telephone utility and a cable television utility. With the advent of the internet and improvements in communications technology, however, these conventional telephone and coaxial cables are less commonly used. In their place, optical fiber cables have been used to provide both telephone and television services, as well as others.

In optical fiber cables, telephone, television, and other signals in the form of light pulses are transmitted along a core of material, such as glass, which is capable of transmitting light. Typically, a reflective coating known as cladding surrounds the core material so that light traveling along the core is internally reflected and propagates along the core. Optical fiber cables have proved to be useful for providing communications services, such as telephone, television, and internet services, and are becoming increasingly commonplace. For example, many modern households and offices now receive telephone, television, and internet services over optical fiber cables. In many cases, a single utility company provides all of these services over a single optical fiber cable. Thus, and because of the essential characteristics of an optical fiber cable, many consumers now have optical fiber cables providing a steady stream of light pulses into their homes or offices.

In another area of consumer technology, solar cells have been developed for converting light energy into electricity. Solar cells are also known as photovoltaic cells because they convert light to electricity according to the photovoltaic effect. In a well known arrangement, solar cells situated on top of a house or a building are positioned to receive sunlight. When the solar cells are exposed to sunlight, electricity is generated. This electricity can be captured and used to supplement, or in some cases replace, electricity from an electric utility. For example, the electricity generated by the solar cells can be used immediately or can be stored in a battery for later use. This reduces the amount of electricity that a consumer purchases from an electric utility. And in cases where excess electricity is generated by solar cells, the electricity can be sold back to the electric utility, which can then sell it to its other customers. Electric utilities currently generate most of the electricity that they sell by burning fossil fuels, such as coal. However, because fossil fuel supplies are limited and because burning fossil fuels is known to create undesirable byproducts, generating electricity by alternative means is currently receiving substantial attention.

There is a need, therefore, for devices and methods that generate electricity, but that do so without consumption of fossil fuels.

SUMMARY OF THE INVENTION

Embodiments of the present invention are directed to apparatus and methods useful for generating electricity from the light carried by an optical fiber cable.

According to one embodiment of the invention, an apparatus is provided for generating electricity using an optical fiber cable light source and for directing the electricity to an electrical circuit configured to be coupled with an electric utility's electric grid. The apparatus includes an enclosure having an input configured to be coupled with the light source for directing light into the enclosure. The apparatus further includes a photovoltaic module contained within the enclosure and configured to generate electricity from the light. The apparatus further includes an electrical output cable coupled with the photovoltaic module and configured to be coupled with the electrical circuit.

According to another embodiment of the invention, a method is provided for generating and using electricity. The method includes directing light carried by an optical fiber cable into an enclosure of a photovoltaic device. The method further includes directing the light inside the photovoltaic device to be incident upon a photovoltaic cell contained inside the enclosure, and generating electricity from the light incident upon the photovoltaic cell. The method further includes directing the electricity from the photovoltaic cell to an electrical circuit.

According to yet another embodiment of the invention, a method is provided for generating and using electricity. The method includes directing light carried by an optical fiber cable into an enclosure of a photovoltaic device. The method further includes directing the light inside the photovoltaic device to be incident upon a photovoltaic cell contained inside the enclosure, and generating electricity from the light incident upon the photovoltaic cell. The method further includes directing the electricity from the photovoltaic cell to an electric utility's electric grid.

Various additional features and advantages of the invention will become more apparent to those of ordinary skill in the art upon review of the following detailed description of the illustrative embodiments taken in conjunction with the accompanying drawings.

BRIEF DESCRIPTION OF THE DRAWINGS

The accompanying drawings, which are incorporated in and constitute a part of this specification, illustrate embodiments of the invention and, together with a general description of the invention given above, and the detailed description of the embodiments given below, serve to explain the principles of the invention.

DETAILED DESCRIPTION OF THE ILLUSTRATIVE EMBODIMENTS

Referring to the figures, a photovoltaic device is shown and is generally indicated by the numeral 10. As will become apparent from the following description, the photovoltaic device 10 is useful for generating electricity from light carried by an optical fiber cable.

Figure 1:
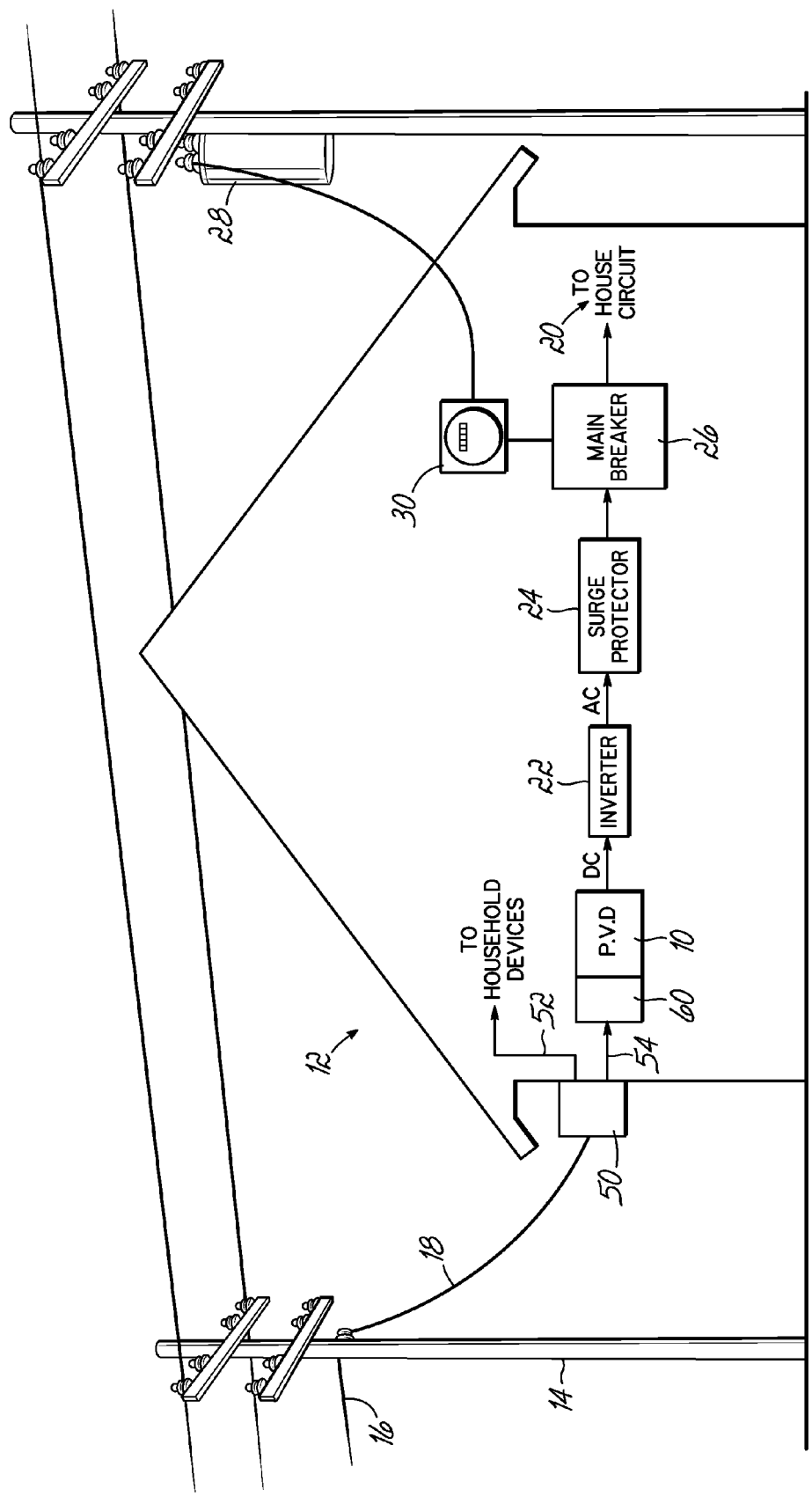
FIG. 1 is a schematic view depicting the environment in which a photovoltaic device according to the present invention may be used.

As best seen in FIG. 1, the photovoltaic device 10 is situated within a house 12. Notably, and in contrast with typical solar cell arrangements, the photovoltaic device 10 is not situated on top of the house 12 and does not need to be positioned to receive sunlight. Advantageously, the photovoltaic device 10 can be situated in a basement, crawl space, closet, or any other area. A utility pole 14 outside the house 12 carries optical fiber cables 16, and may also carry other types of utility service cables, such as those carrying electricity. An optical fiber cable drop 18 is coupled with the optical fiber cables 16 and provides an optical fiber cable source into the house 12. Thereby, light carried by the optical fiber cable 16 is directed to the optical fiber cable drop 18 to the house 12. While FIG. 1 shows a utility pole 14, it will also be appreciated that utility service cables, including the optical fiber cables 16, could also be positioned underground. In any event, an optical fiber cable drop 18 still couples with the optical fiber cables 16 and provides an optical fiber cable source into the house 12. Also, while a house 12 is shown, it will be appreciated that the photovoltaic device 10 is also useful in an office building or any other type of structure that uses electricity and that receives light from an optical fiber cable. The teachings contained herein are readily adaptable from the context of the house 12 to the circumstances presented by another type of structure.

As shown in FIG. 1, the photovoltaic device 10 is positioned, essentially, between the optical fiber cable drop 18 and the house's electrical circuit 20. The photovoltaic device 10 generates electricity using light provided from the optical fiber cables 16 over the optical fiber cable drop 18 and provides the electricity to the electrical circuit 20. The photovoltaic device 10 may be electrically coupled with the electrical circuit 20 in any appropriate manner.

For example, the photovoltaic device 10 includes photovoltaic cells (as will be described further below) that generate electricity in direct current (DC) form. An inverter 22 is electrically coupled with the photovoltaic device 10 to convert the electricity in DC form generated by the photovoltaic device 10 into alternating current (AC) form. A surge protector 24 may also be provided, such as electrically coupled with the inverter 22, for reducing the likelihood that electrical surges will damage the electrical components in the house 12, including the photovoltaic device 10. The photovoltaic device 10 is electrically coupled with the house's main breaker 26, and electricity generated by the photovoltaic device 10 is directed to the electrical circuit 20 through the main breaker 26.

The main breaker 26 is also electrically coupled with and receives electricity from an electric utility's electrical grid 28. Electricity from the electrical grid 28 can thereby be directed to the electrical circuit 20. The main breaker 26 also serves to reduce the likelihood that electrical surges will damage the electrical components in the house 12, including the photovoltaic device 10. An electric meter 30 measures the amount of electricity provided from the electrical grid 28 into the house 12. Thus, in the house 12, the electrical circuit 20 is electrically coupled with and receives electricity from both the photovoltaic device 10 and the electrical grid 28.

Figure 2:
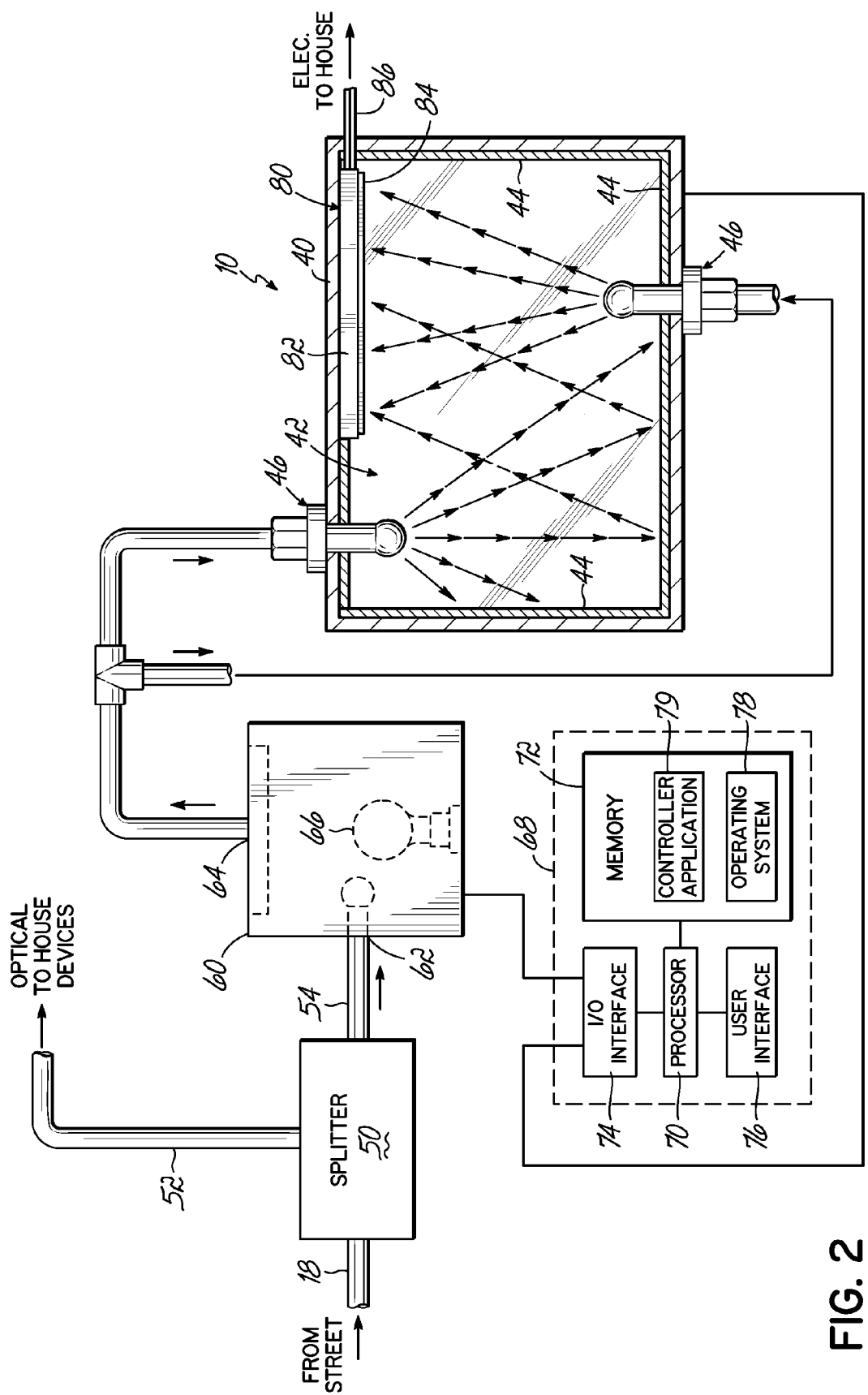
FIG. 2 is a schematic view in partial section showing features of the photovoltaic device of FIG. 1.
Figure 3:
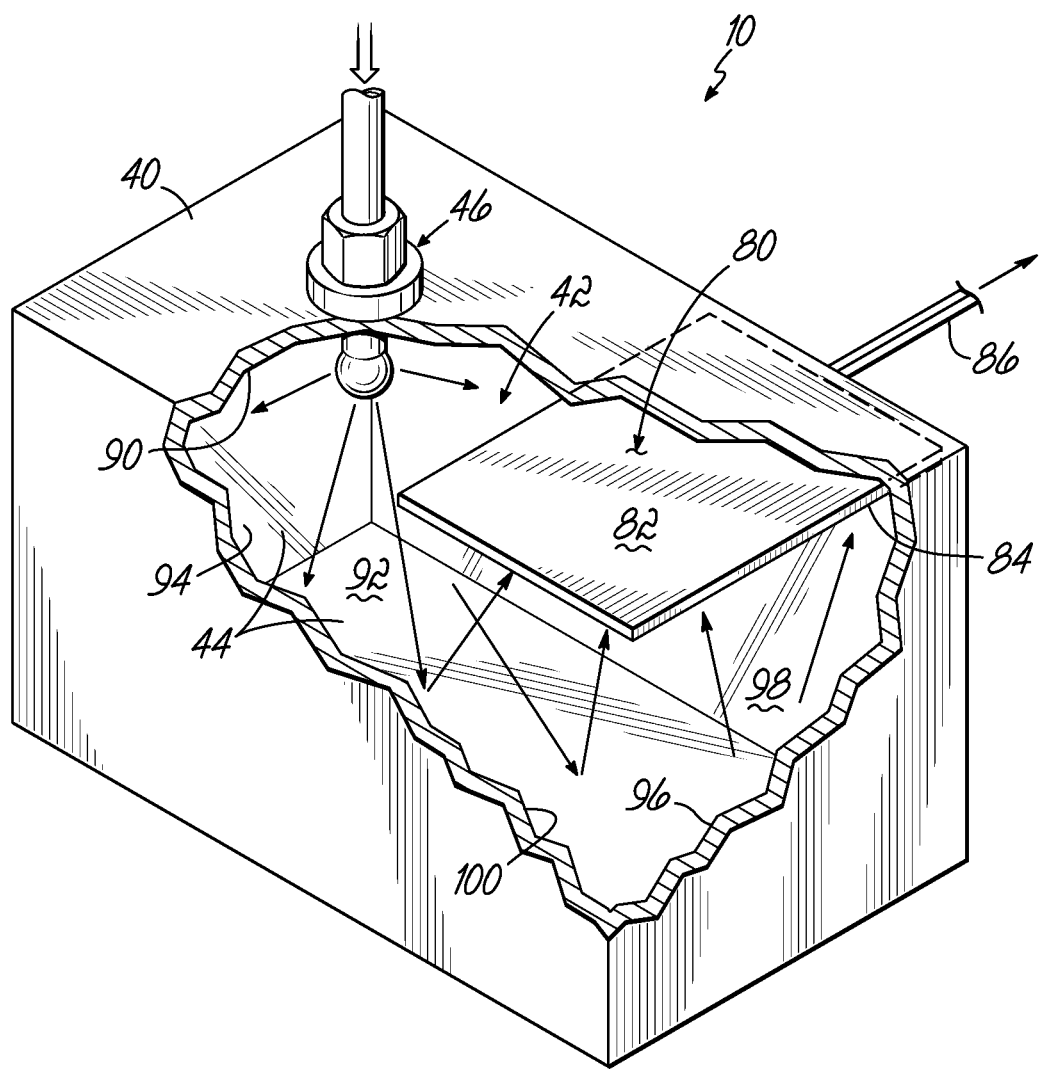
FIG. 3 is an isometric view in partial section showing features of the photovoltaic device of FIG. 1.

Turning next to FIGS. 2 and 3, features of the photovoltaic device 10 are described. Photovoltaic device 10 includes an enclosure 40 for containing its several components. Advantageously, the enclosure 40 presents a light-tight environment, in which light that is directed into the enclosure 40 does not escape. As shown, the enclosure 40 has a six-sided box shape, but other shapes could also be used. An interior cavity 42 is defined within the enclosure 40, and light is directed into the interior cavity 42. The interior cavity 42 can include reflective surfaces 44, such as mirrors or other reflective coatings for reflecting light therein.

The optical fiber cable drop 18 provides a source of light for introduction into the enclosure 40 of the photovoltaic device 10. This introduction of light from the optical fiber cable drop 18 can be by directly coupling the optical fiber cable drop 18 with the photovoltaic device 10, or by indirectly coupling it through one or more intermediate devices. For example, and in the embodiment shown, the optical fiber cable drop 18 is coupled with a splitter box 50, which has two optical fiber cable outputs 52, 54. Light carried by the optical fiber cable drop 18 is directed to the splitter box 50. The first optical fiber cable output 52 can be used to provide telephone, television, internet, and other communications services to suitable household devices in the house 12. The second optical fiber cable output 54 directs light to the photovoltaic device 10.

In particular, the second optical fiber cable output 54 of the splitter box 50 can be coupled directly with the interior cavity 42 of the photovoltaic device 10, or as is shown in the figures, can be coupled with a light modulator 60, which in turn is coupled with the interior cavity 42 so as to direct light thereto. The second optical fiber cable output 54 directs light from the splitter box 50 to the light modulator 60. The light modulator 60 is configured to provide control over, or modulate, the light introduced into the interior cavity 42 of the enclosure 40. To that end, the light modulator 60 includes an input 62 for receiving the optical fiber cable output 54 and an output 64 that is coupled with one or more inputs 46 of the enclosure 40 for directing light into the interior cavity 42. The light modulator 60 can be part of the photovoltaic device 10, or can be a separate device. The light modulator 60 includes the necessary components for modulating the light received from the input 62.

The light modulator 60 can also optionally include one or more auxiliary light sources 66 for supplementing the light received from the optical fiber cable drop 18 (the light entering the house) and directed into the enclosure 40. For example, the auxiliary light source can include an LED, a laser, or any other light source, and can be selected to control the characteristics of light directed to the photovoltaic device 10. For example, an auxiliary light source can be chosen based on the wavelength(s) of light it provides, which can influence the efficiency of electricity creation in the photovoltaic device 10. In some embodiments, using a so-called "full-spectrum" light source is advantageous. A full spectrum light source provides light over a range of wavelengths that simulates a portion of the light provided by the Sun. Light received from the second optical fiber cable output 54 can be combined with light from the auxiliary source(s) 66 in any appropriate manner. Thereby, the auxiliary light source 66 is configured to provide additional light or alternative light into the enclosure 40 as controlled by the light modulator 60.

Likewise, light can be supplied from the light modulator 60 to the photovoltaic device 10 in any appropriate manner. For example, the output 64 of the light modulator 60 that directs light to the enclosure 40 can include so-called optical fiber end tips for controlling the emission of light from the terminal end of an optical fiber cable.

The photovoltaic device 10 also includes at least one photovoltaic module 80 positioned in, or contained in, the interior cavity 42 of the enclosure 40. The photovoltaic module 80 includes an array of photovoltaic cells 82 configured to convert incident light into electricity. An antireflective coating 84 may optionally be provided over the photovoltaic cells 82 to internally reflect light that is incident on the cells 82. An electrical output cable 86 is electrically coupled with the photovoltaic cells 82 to carry electricity from the photovoltaic module 80 and out of the enclosure 40. Advantageously, the photovoltaic module 80 may be designed so the photovoltaic cells 82 and antireflective coating 84 create an optimum amount of electricity based on the characteristics of the light directed into the enclosure 40. For example, the photovoltaic cells 82 may be chosen to be optimized for the wavelength of the light directed over the optical fiber cable drop 18, by the second optical fiber cable output 54, or from the output 64 of the light modulator 60. Of course, multiple photovoltaic modules 80 can also be used.

As shown in FIGS. 2 and 3, light directed into the interior cavity 42 is reflected off the reflective surfaces 44 and is redirected in many directions, and at many angles, within the enclosure 40. For example, in the six-sided box configuration shown in the figures, light originating near a top surface 90 of the interior cavity 42 can be directed toward an opposed bottom surface 92, where it is reflected by the reflective surface 44 (as schematically depicted in FIG. 3). The light can also be directed toward side surfaces 94, 96, 98, and 100, where it is also reflected by the reflective surfaces 44 (as schematically depicted in FIG. 2). It is contemplated that light will be directed into the interior cavity 42 at a variety of angles, and the light will be internally reflected therein by the reflective surfaces 44. It is also contemplated that light will be introduced into the interior cavity 42 at multiple locations through multiple inputs 46, as shown. Eventually, the light will travel to the vicinity of the photovoltaic module 80 and will be incident on the photovoltaic cells 82. The light is absorbed by the photovoltaic cells 82, or internally reflected by the antireflective coating 84 and then absorbed by the photovoltaic cells 82. Light absorbed by the photovoltaic cells 82 is converted into electricity that is carried out of the enclosure 40 by the electrical output cable 86. The electricity carried by the electrical output cable 86 can be directed to the house's electrical circuit 20, as discussed above.

The light modulator 60 is operatively coupled with a controller 68. The controller 68 includes a processor 70, a memory 72, an input/output (I/O) interface 74, and a user interface 76.

The processor 70 may include one or more devices selected from microprocessors, micro-controllers, digital signal processors, microcomputers, central processing units, field programmable gate arrays, programmable logic devices, state machines, logic circuits, analog circuits, digital circuits, or any other devices that manipulate signals (analog or digital) based on operational instructions that are stored in the memory 72. Memory 72 may be a single memory device or a plurality of memory devices including but not limited to read-only memory (ROM), random access memory (RAM), volatile memory, non-volatile memory, static random access memory (SRAM), dynamic random access memory (DRAM), flash memory, cache memory, or any other device capable of storing digital information. Memory 72 may also include a mass storage device (not shown) such as a hard drive, optical drive, tape drive, non-volatile solid state device or any other device capable of storing digital information.

Processor 70 may operate under the control of an operating system 78 that resides in memory 92. The operating system 78 may manage controller resources so that computer program code embodied as one or more computer software applications, such as a controller application 79 residing in memory 72, may have instructions executed by the processor 70. In an alternative embodiment, the processor 70 may execute the applications 79 directly, in which case the operating system 78 may be omitted.

The I/O interface 74 operatively couples the processor 70 to other components, such as the light modulator 60 and the photovoltaic device 10. The I/O interface 74 may include signal processing circuits that condition incoming and outgoing signals so that the signals are compatible with both the processor 70 and the components to which the processor 70 is coupled. To this end, the I/O interface 74 may include analog-to-digital (A/D) and/or digital-to-analog (D/A) converters, voltage level and/or frequency shifting circuits, optical isolation and/or driver circuits, and/or any other analog or digital circuitry suitable for coupling the processor 70 to the other.

The user interface 76 may be operatively coupled to the processor 70 of controller 68 in a known manner to allow a system operator to interact with the controller 68. The user interface 76 may include a display such as a video monitor, alphanumeric displays, a touch screen, a speaker, and any other suitable audio and visual indicators capable of providing information to the system operator. User interface 76 may also include input devices and controls such as an alphanumeric keyboard, a pointing device, keypads, pushbuttons, control knobs, microphones, etc., capable of accepting commands or input from the operator and transmitting the entered input to the processor 70. In this way, user interface 76 may enable manual initiation or selection of system functions, for example, operation of the light modulator 60 and operation of the photovoltaic device 10. For example, the user interface 76 can provide control over the auxiliary light source 66, so that a system operator can control the light provided by the light modulator 60 to the photovoltaic device 10.

Thus, and referring now to FIGS. 1-3, light directed into the house 12 from the optical fiber cable drop 18 can be used to generate electricity. Beginning at the optical fiber cables 16, light transmitted therein is directed to the optical fiber cable drop 18 and is transmitted into the house 12. Light transmitted in the optical fiber cable drop 18 can either be directly or indirectly coupled with the photovoltaic device 10. For example, and as shown, light in the optical fiber cable drop 18 is first transmitted to the splitter box 50. The splitter box 50 directs light toward the photovoltaic device 10, either directly, or through the light modulator 60. Light is ultimately directed into the interior cavity 42 of the enclosure 40, where it is internally reflected by the reflective surfaces 44. The light is eventually absorbed by the photovoltaic cells 82 of the photovoltaic module 80 and is converted into electricity. Electricity generated by the photovoltaic cells 82 is carried from the photovoltaic device 10 by the electrical output cable 86 and is directed to the electrical circuit 20. For example, the electrical output cable 86 can carry electricity in DC form which is converted into AC form by the inverter 22. Electricity in AC form is then directed to the main breaker 26, from where it is directed to the electrical circuit 20. Thereby, the electricity generated by the photovoltaic device 10 is joined with the electricity from the electric grid 28. Any electric device that is electrically coupled with the electrical circuit 20 can be operated by the electricity from either or both of the photovoltaic device 10 and the electric grid 28.

Optionally, the electricity created by the photovoltaic device 10 can be directed back to the electric grid 28. For example, the owner of the house 12 or the owner of the photovoltaic device 10 (which may be the same) could sell or give the electricity generated by the photovoltaic device 10 back to the electric utility, to the owner of the optical fiber cables 16 that provide the light used to generate the electricity, or to any other person.

Also optionally, the electrical circuit 20 may only receive electricity from the photovoltaic device 10. For example, the electrical circuit 20 may not be coupled with the electric grid 28, in which case the electricity generated by the photovoltaic device 10 would be the only electricity provided to the electrical circuit 20. In such a case, any electric device that is electrically coupled with the electrical circuit 20 would be operated using only the electricity from the photovoltaic device 10.

Also further optionally, the electricity generated by the photovoltaic device 10 may be electrically coupled with an electricity storage device, such as a battery, before being coupled with the electrical circuit 20 or instead of being coupled with the electrical circuit 20, for example.

Any or all of the components of the photovoltaic device 10, or any of the related components associated with providing the electricity it creates to the house circuit 20 can be remotely monitored or controlled. For example, the light modulator 60, the controller 68, and the inverter 22 can be connected to a communications interface, such as through a computer-network connection, in a manner that allows them to be monitored and controlled from a distant location.

While the present invention has been illustrated by the description of specific embodiments thereof, and while the embodiments have been described in considerable detail, it is not intended to restrict or in any way limit the scope of the appended claims to such detail. The various features discussed herein may be used alone or in any combination. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of the general inventive concept.

What is claimed is:

1. An apparatus for generating electricity and providing electricity to an electrical circuit configured to be coupled with an electrical grid, the electricity generated using a light source and an optical fiber coupled with the light source, the apparatus comprising:
   a light modulator configured to generate additional light that accompanies light produced by the light source to a photovoltaic module;
   a photovoltaic module configured to generate the electricity from the light produced by the light source and the additional light generated by the light modulator, wherein the electricity is generated from the light produced by the light source and the additional light that is absorbed by the photovoltaic module;
   an enclosure that includes a plurality of reflective surfaces and having a first input coupled by the optical fiber cable with the light source and the light modulator and configured to:
      receive the light generated by the light source from the optical fiber cable and the additional light from the light modulator into the enclosure to contain the light produced by the light source and the additional light in a light-tight environment as the light produced by the light source and the additional light are directed to the photovoltaic module, which is included in the enclosure, and
      reflect the light produced by the light source and the additional light with the plurality of reflective surfaces toward the photovoltaic module to optimize the portion of the light produced by the light source and the additional light that is absorbed by the photovoltaic module;
   and
   an electrical output cable coupled with the photovoltaic module and the electrical circuit and configured to transmit the electricity generated by the photovoltaic module to the electrical circuit.

2. The apparatus of claim 1, further comprising:
   the light modulator including an auxiliary light source configured to provide additional light or alternative light into the enclosure as controlled by the light modulator.

3. The apparatus of claim 2, wherein the auxiliary light source is a full-spectrum light source.

4. The apparatus of claim 2, further comprising:
   a controller operatively coupled with the light modulator and configured to control the light modulator.

5. The apparatus of claim 1, wherein the enclosure includes a second input configured to direct the light from the optical fiber cable into the enclosure.

6. The apparatus of claim 1, further comprising:
   an electricity storage device electrically coupled with the electrical output cable and configured to store the electricity generated by the photovoltaic module.

7. The apparatus of claim 1, further comprising:
   an inverter electrically coupled with the electrical output cable and configured to convert electricity created by the photovoltaic module in direct current form into alternating current form.

8. A method of generating and providing electricity to an electrical circuit configured to be coupled with an electrical grid, the electricity generated using a light source and an optical fiber coupled with the light source, the method comprising:
   directing light produced by the light source and carried by an optical fiber cable into an enclosure of a photovoltaic device;
   generating additional light by a light modulator that accompanies the light produced by the light source to the photovoltaic device;
   directing the light produced by the light source and the additional light inside the photovoltaic device to be incident upon a photovoltaic cell contained inside the enclosure;
   generating electricity from the light produced by the light source and the additional light generated by the light modulator that is incident upon the photovoltaic cell, wherein the electricity is generated from the light produced by the light source and the additional light that is absorbed by the photovoltaic device;
   receiving, by an enclosure that includes a plurality of reflective surfaces, the light produced by the light source from the optical fiber cable and the additional light from the light modulator to contain the light produced by the light source and the additional light in a light-tight environment as the light produced by the light source and the additional light is directed to the photovoltaic device included in the enclosure;
   reflecting the light produced by the light source and the additional light with a plurality of reflective surfaces toward the photovoltaic cell to optimize the portion of the light produced by the light source and the additional light that is absorbed by the photovoltaic cell; and
   directing, by an electrical output cable, the electricity from the photovoltaic cell to an electrical circuit.

9. The method of claim 8, the optical fiber cable being coupled with an optical fiber cable drop, and the optical fiber cable drop being coupled with a splitter box;
the method further comprising:
before directing the light into the enclosure, directing the light carried by the optical fiber cable to the optical fiber cable drop, and directing the light carried by the optical fiber cable drop to a splitter box.

10. The method of claim 8, wherein directing the light into the enclosure includes directing the light into the enclosure at multiple locations.

11. The method of claim 8, further comprising:
before directing the light into the enclosure, directing the light into a light modulator;
generating light with an auxiliary light source in the light modulator; and
before directing the light into the enclosure, mixing the light directed into the light modulator with the light generated by the auxiliary light source.

12. The method of claim 11, wherein generating light with the auxiliary light source includes generating full-spectrum light.

13. The method of claim 8, wherein generating the electricity comprises:
generating the electricity in direct current form;
the method further comprising:
converting the electricity in direct current form to alternating current form.

14. The method of claim 8, further comprising:
operating an electric device electrically coupled with the electrical circuit using the electricity from the photovoltaic cell.

15. The method of claim 8, further comprising:
operating an electric device electrically coupled with the electrical circuit using only the electricity from the photovoltaic cell.

16. A method of generating and providing electricity to an electric utility's electric grid, the electricity generated using a light source and an optical fiber coupled with the light source, the method comprising:

directing light produced by the light source and carried by an optical fiber cable into an enclosure of a photovoltaic device;
generating additional light by a light modulator that accompanies the light produced by the light source to the photovoltaic device;
directing the light produced by the light source and the additional light inside the photovoltaic device to be incident upon a photovoltaic cell contained inside the enclosure;
generating electricity from the light produced by the light source and the additional light generate by the light modulator that is incident upon the photovoltaic cell, wherein the electricity is generated from the light produced by the light source and the additional light that is absorbed by the photovoltaic device;
receiving, by an enclosure that includes a plurality of reflective surfaces, the light produced by the light source from the optical fiber cable and the additional light from the light modulator to contain the light produced by the light source and the additional light in a light-tight environment as the light produced by the light source and the additional light is directed to the photovoltaic device included in the enclosure;
reflecting the light produced by the light source and the additional light with a plurality of reflective surfaces toward the photovoltaic device to optimize the portion of the light produced by the light source and the additional light that is absorbed by the photovoltaic device; and
directing, by an electrical output cable, the electricity from the photovoltaic cell to an electric utility's electric grid.

17. The method of claim 16, wherein generating the electricity comprises:
generating the electricity in direct current form;
the method further comprising:
converting the electricity in direct current form to alternating current form.

* * * * *